United States Patent
Sun et al.

(10) Patent No.: US 7,675,182 B2
(45) Date of Patent: Mar. 9, 2010

(54) DIE WARPAGE CONTROL

(75) Inventors: Hai Xiao Sun, Pudong (CN); Daoqiang Lu, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 11 days.

(21) Appl. No.: 11/862,844

(22) Filed: Sep. 27, 2007

(65) Prior Publication Data

US 2009/0085228 A1    Apr. 2, 2009

(51) Int. Cl.
 *H01L 23/29* (2006.01)
(52) U.S. Cl. .............. 257/778; 257/788; 257/690; 257/E23.117
(58) Field of Classification Search .......... 257/788, 257/778, 690, E23.117
See application file for complete search history.

(56) References Cited

U.S. PATENT DOCUMENTS

| | | | | |
|---|---|---|---|---|
| 5,619,177 | A * | 4/1997 | Johnson et al. | 337/140 |
| 5,888,884 | A * | 3/1999 | Wojnarowski | 438/462 |
| 2006/0180926 | A1* | 8/2006 | Mullen et al. | 257/727 |
| 2008/0006914 | A1* | 1/2008 | Nagai | 257/668 |
| 2009/0017195 | A1* | 1/2009 | Vallance et al. | 427/96.2 |

* cited by examiner

*Primary Examiner*—Victor A Mandala
(74) *Attorney, Agent, or Firm*—Blakely, Sokoloff, Taylor & Zafman LLP

(57) ABSTRACT

A semiconductor package comprises a substrate; a semiconductor die that comprises a set of one or more interconnects on one side to couple to the substrate; and a shape memory alloy layer provided on another side of the semiconductor die to compensate warpage of the semiconductor die. The shape memory alloy layer deforms with warpage of the semiconductor die and changes from the deformed shape to an original shape to flatten the semiconductor die in response to rise of a temperature during coupling of the die to the substrate.

10 Claims, 5 Drawing Sheets

DIE WARPAGE CONTROL

BACKGROUND

A semiconductor package may comprise one or more semiconductor dies that are attached to a substrate. A die may be both electrically and mechanically coupled to a substrate using, for example, a flip-chip interconnect technique or by wirebonding in conjunction with a die-attach adhesive. During manufacture (and perhaps use), a semiconductor die may be susceptible to warpage, and such warpage may, for example, lead to inconsistent interconnect formation between a die and a substrate and/or to delamination between the die and substrate. Several factors may impact the extent of any die warpage, including the thickness of the die, processing temperatures (e.g. during solder reflow), differences in coefficient of thermal expansion (CTE) between the die and substrate, as well as other factors.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

DETAILED DESCRIPTION

Figure 1:
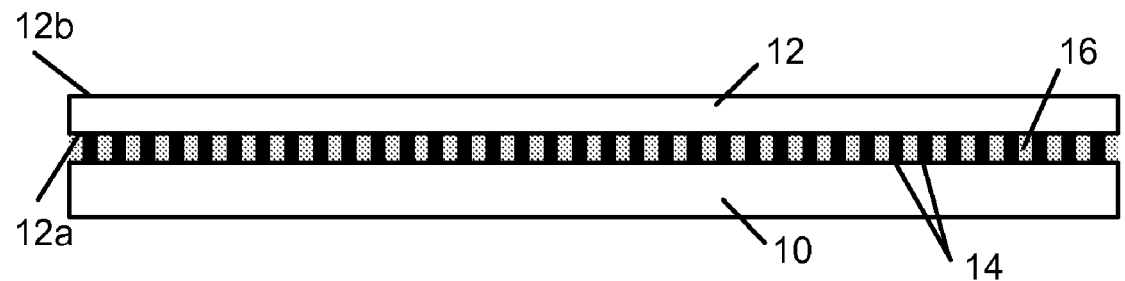
FIGS. 1-6 are schematic diagrams of a method that may be used to form a semiconductor package.

In the following detailed description, references are made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numbers refer to the same or similar functionality throughout the several views.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

The following description may include terms, such as upper, lower, top, bottom, first, second, etc. that are used for descriptive purposes only and are not to be construed as limiting.

Figure 2:
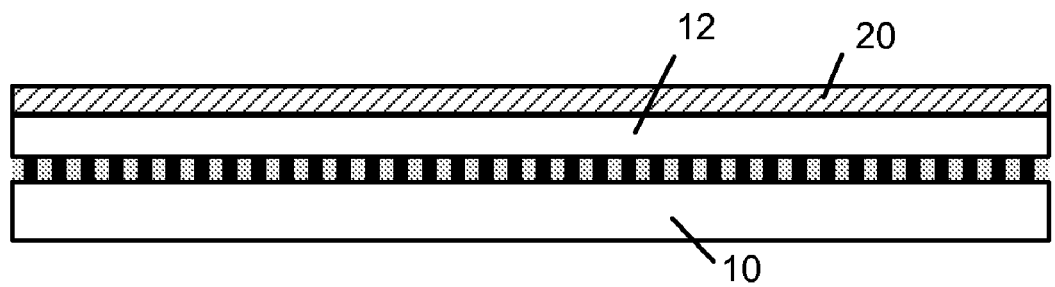

FIGS. 1-6 illustrate an exemplary embodiment of a method that may be used to form a semiconductor package. Referring to FIG. 1, in one embodiment, a wafer 12 may be mounted on a first substrate 10 that may support the wafer 12 and keep the wafer 12 flat. For example, materials for the first substrate 10 may comprise glass or silicon; however, any other substrate material may be utilized. For example, wafer 12 may have a thickness less than around 200 um; however, in some embodiments, wafer 12 may have a different thickness. In one embodiment, wafer 12 may comprise one or more bumps 14 on a lower side 12a; however, in some embodiments, any other protruding interconnect such as gold stud bump or conductive protrusion may be utilized. In another embodiment, an adhesive 16, e.g., epoxy, silicone or any other adhesives, may be used to secure wafer 12 to the first substrate 10. Referring to FIG. 2, a shape memory alloy (SMA) layer 20 may be deposited on a back side 12b of wafer 12. In another embodiment, a back side metallization (BSM) layer 22 may be deposited on the SMA layer 20; however, in some embodiments, BSM layer 22 may not be required. For example, exemplary materials for BSM layer 22 may comprise nickel (Ni) and/or gold (Au); however, in some embodiments, any other BSM materials may be utilized.

Figure 3:
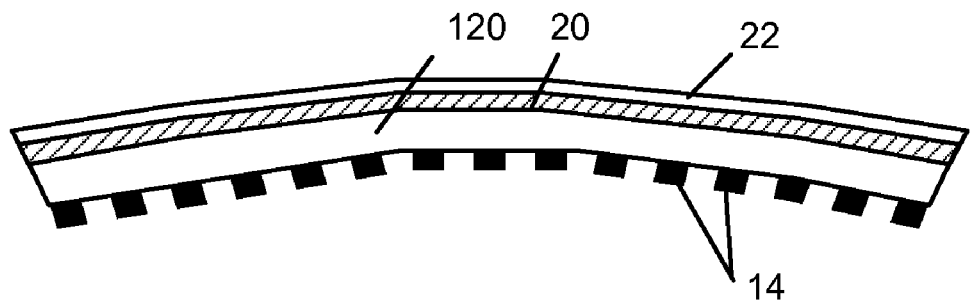
Figure 4:
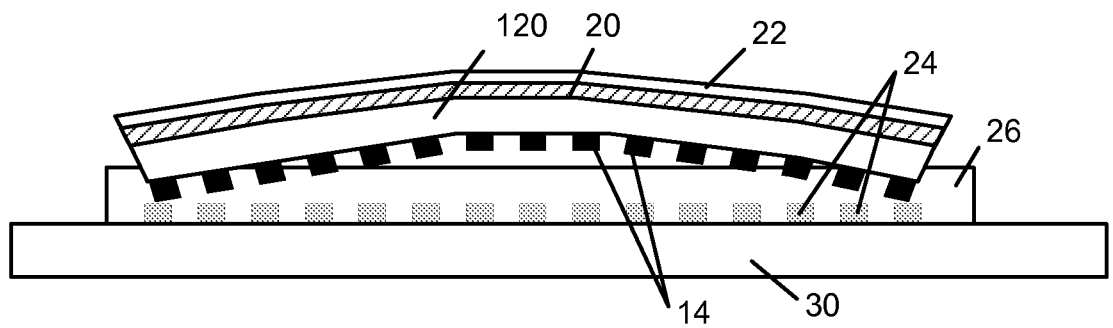

In one embodiment, the wafer 12 may be divided into one or more dies 120 of FIG. 3. Referring to FIG. 3, a die 120 may deform, e.g., become warped, if the die 120 is released from the first substrate 10. In another embodiment, the SMA layer 20 on the die 120 may warp with the die 120. For example, the SMA layer 20 may transform from an original shape as shown in FIG. 2, e.g., flat, to a deformed shape, e.g., warped, as shown in FIG. 3 in response to the warpage of the die 120. In another embodiment, referring to FIG. 7, the SMA layer 20 may transform from a twinned martensite phase (the original shape of FIG. 2) to a deformed martensite phase (the deformed shape of FIG. 3). As shown in FIG. 4, a die 120 may be placed on a second substrate 30; however, in some embodiment, more than one dies may be provided on a substrate. The second substrate 30 may comprise one or more bumps 24 that may each correspond to a bump 14 on the die 120. A flux 26 (for example, rosin) may be applied to the second substrate 30; however, in some embodiments, a flux may not be required.

Figure 5:
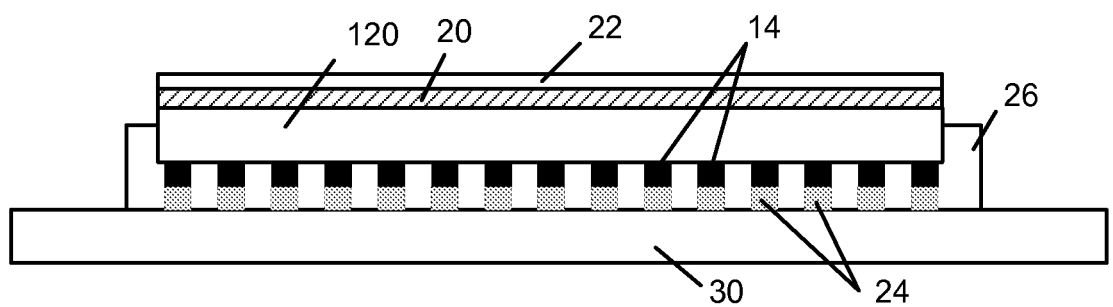
Figure 6:
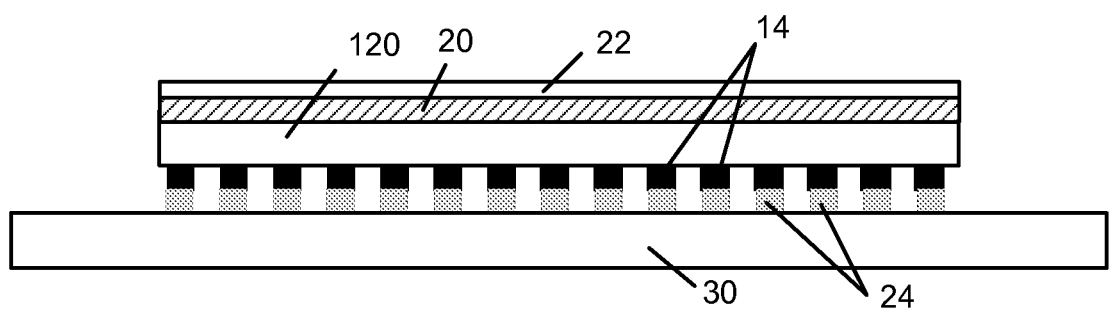
Figure 7:
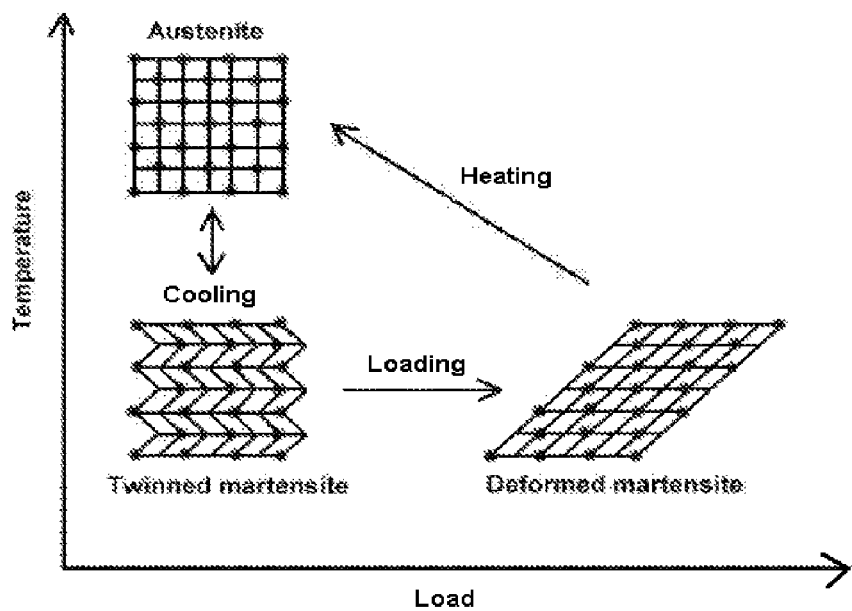
FIG. 7 is a schematic diagram that may illustrate lattice structure of shape memory alloy during phase transformation.

A reflow may be applied to interconnect die 120 to the second substrate 30. In response to the die 120 and/or the second substrate 30 being heated up, the SMA layer 20 may become harder. Referring to FIG. 5, the SMA layer 20 may restore the original shape with the rise of a temperature during the reflow. Further, referring to FIG. 7, the SMA layer 20 may change from the deformed martensite phase (the deformed shape of FIG. 4) to an austenite phase (the original shape as shown in FIG. 5) in response to the rise of reflow temperature to compensate warpage of the die 120. Referring again to FIG. 5, a restoration force of the SMA layer 20 may flatten the die 120. Referring to FIG. 6, the reflow may bond a bump 14 of the die 120 to a bump 24 of the second substrate 30. For example, a solder (not shown) may be used to bond a bump 14 to a bump 24 of the second substrate 30. Referring to FIG. 7, after the reflow, the SMA layer 20 may change from the austenite phase to the twinned martensite phase in response to the die 120 being cooled. In another embodiment, as shown in FIG. 6, the SMA layer 20 may remain the original shape with the drop of the temperature.

In one embodiment, examples for the material for the SMA layer 20 may comprise copper-zinc-aluminium-nickel, copper-aluminium-nickel, iron-manganese-silicon, and nickel-titanium alloys. In another embodiment, the SMA layer 20 may comprise SMA material that may have a transformation temperature that may be not higher than the reflow temperature of the solder. In one embodiment, the SMA layer 20 may comprise SMA material that may have a transformation temperature in a range from around 200° C. to around 260° C.

Figure 8:
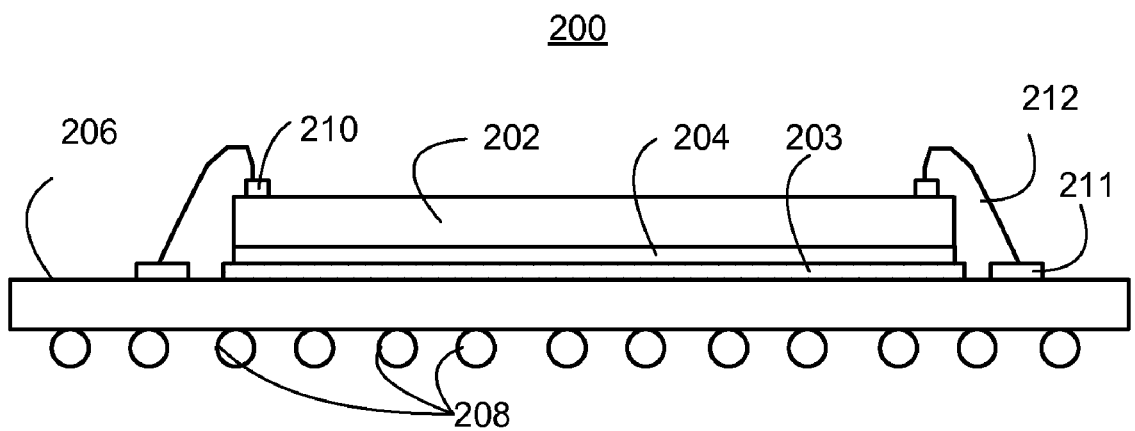
FIG. 8 is a schematic diagram of an embodiment of a semiconductor package that may use shape memory alloy.

FIG. 8 illustrates an embodiment of a semiconductor package 200 that may use SMA. In one embodiment, the semiconductor package 200 may comprise a substrate 206. The substrate 206 may comprise one or more outer metal pads 211; however, some embodiments may use one or more bond pads, bond areas or any other structure for wire bonding. The substrate 206 may be a ball grid array (BGA) substrate that may comprise a set of one or more solder balls 208 on one side, e.g., a lower side of FIG. 8; however, in some embodiments, any other external interconnects may be utilized. A semiconductor die 202 may be attached to the substrate 206 through a die attach adhesive 203, such as epoxy; however, in some embodiments, more than one die may be attached on the substrate 206. In another embodiment, the die 202 may be coupled to the substrate 206 by one or more bond wires 212 that may each couple to a bond pad 210 on the die 202 and metal pads 211 on the substrate 206. In yet another embodiment, the die 202 may comprise a SMA layer 204 on a back side, e.g., a lower side of FIG. 8, that may not comprise an interconnect.

In one embodiment, similar to the SMA layer 20 of FIG. 3, the SMA layer 204 may have an original shape such as a flat shape. In another embodiment, the SMA layer 204 may have a deformed shape with warpage of the die 202, e.g., at around room temperature, in response to the die 202 being released from a support substrate (not shown). In another embodiment, the SMA layer 204 may comprise SMA materials that may have a transformation temperature no higher than a temperature to cure the die attach adhesive 203 to attach the die 202 to the substrate 206. For example, the SMA layer 204 may have a transformation temperature to restore an original shape of the SMA layer 204. For example, the transformation temperature may be in a range from around 100° C. to around 200° C. The SMA layer 204 may have a phase change to restore the original shape in response to the die 202 and/or the substrate 206 being heated. The SMA layer 204 may restore the original shape from the deformed shape with the rise of the temperature during the curing of the die attach adhesive 203. The shape restoration of the SMA layer 204 may flatten the die 202.

Figure 9:
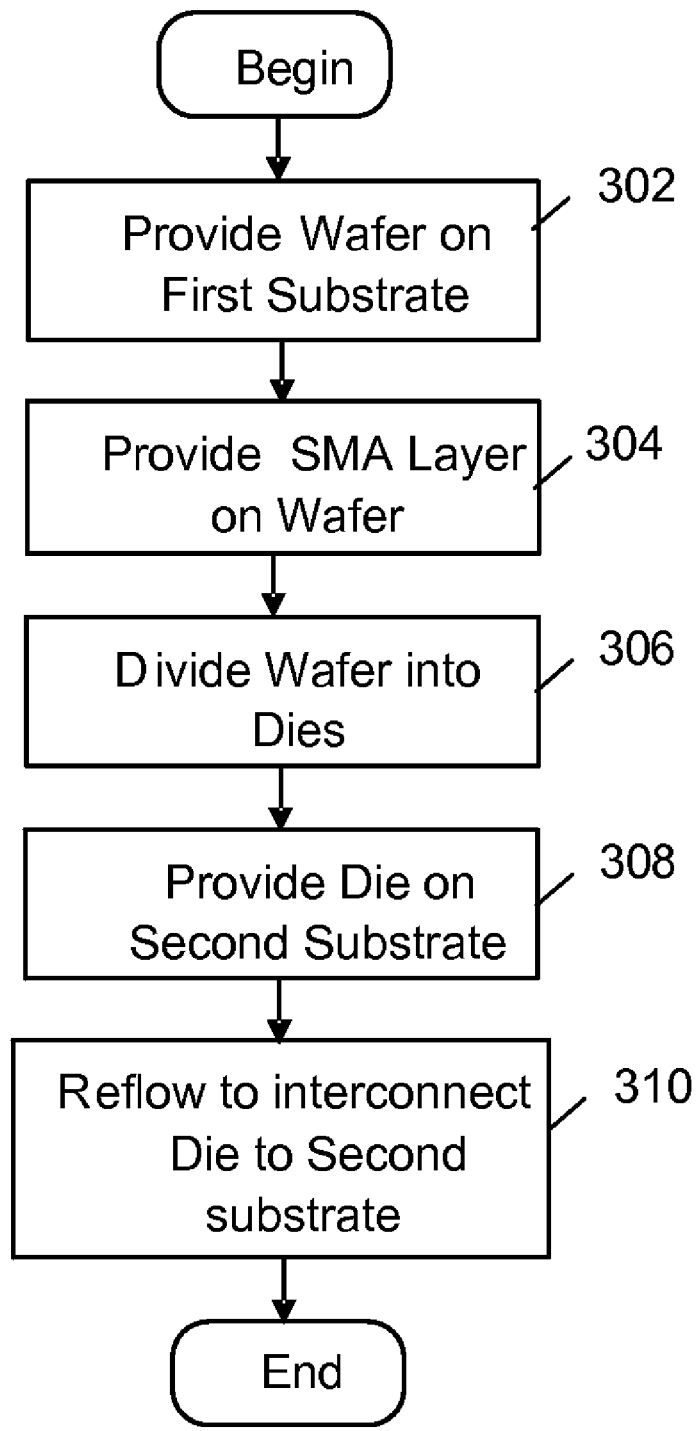
FIG. 9 is a schematic diagram of an embodiment of a method that may form the semiconductor package of FIG. 6.

FIG. 9 illustrates an embodiment of a method that may be used to form the semiconductor package of FIG. 6. In one embodiment, in block 302, wafer 12 may be provided on the first substrate 10. In block 304, the SMA layer 20 may be provided on the wafer 12. In one embodiment, the BSM layer 22 may be provided on the SMA layer 20; however, in some embodiments, the BSM layer 22 may not be required. The SMA layer 20 may have an original flat shape in block 304. In block 306, the wafer 12 may be released from the first substrate 10. The wafer 12 may be divided into one or more dies 120; however, in some embodiments, the wafer 12 may be divided into dies 120 before the wafer 12 being released from the first substrate 10. The SMA layer 20 may be deformed with warpage of a die 120 in response to the die 120 being released from the first substrate 10. In another embodiment, in block 306, the wafer 12 may be divided into dies 120 and then the SMA layer 20 may be deposited on each die 120.

In block 308, a die 120 may be provided on the second substrate 30. In block 310, a reflow may be applied to a solder (not shown) to bond a bump 14 of the die 120 to a bump 24 of the second substrate 30 to interconnect the die 120 with the second substrate 30. The SMA layer 20 may have a phase change from a deformed martensite phase to an austenite phase to restore the original flat shape with rise of a temperature during the reflow. Then, the SMA layer 20 may change from the austenite phase to the original twinned martensite phase in response to the die 120 and/or the second substrate 30 being cooled down. In another embodiment, in block 308 or in block 310, the flux 26 may be applied to the second substrate 30 and then may be removed; however, in some embodiments, the flux 26 may not be required.

Figure 10:
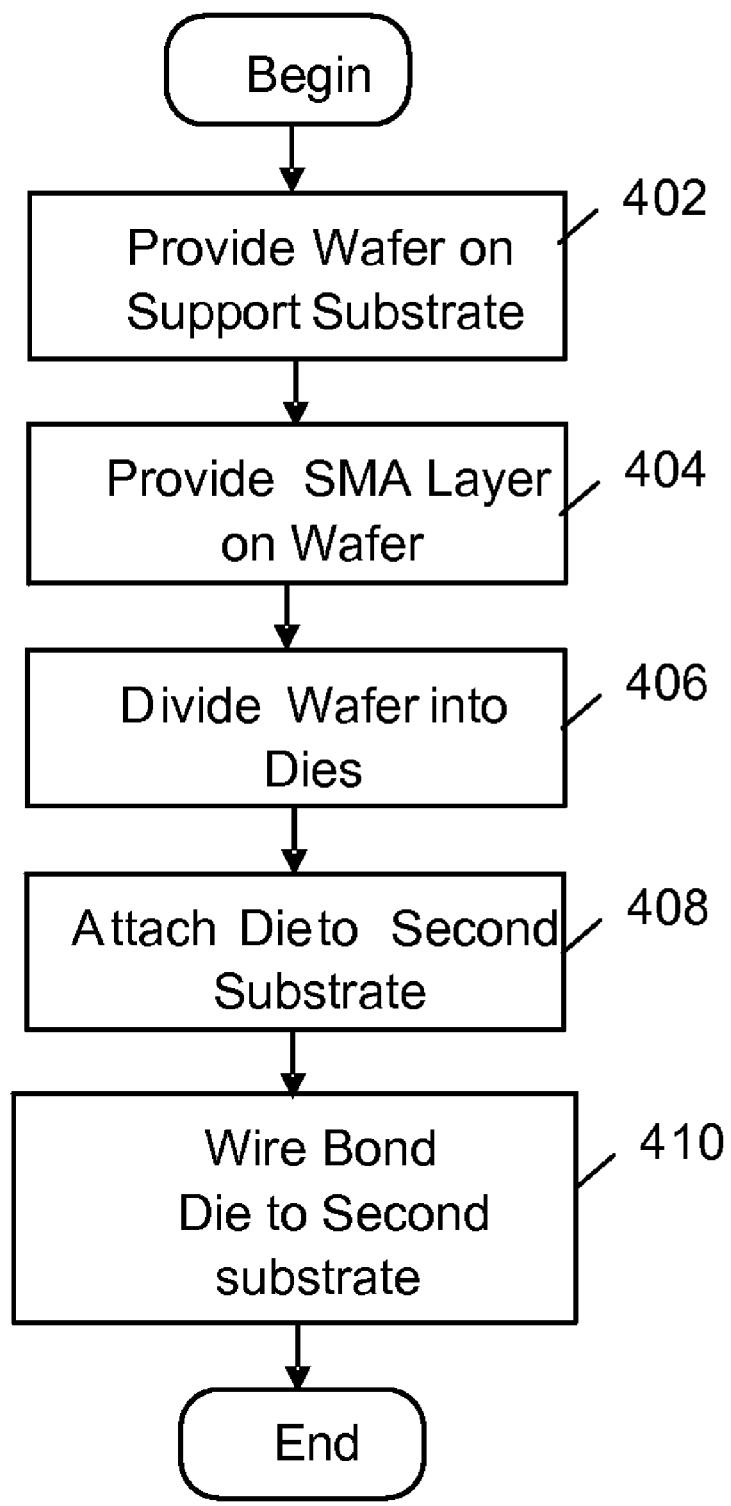
FIG. 10 is a schematic diagram of an embodiment of a method that may form the semiconductor package of FIG. 8.

FIG. 10 illustrates a method that may be used to form the semiconductor package 200 of FIG. 8. In one embodiment, description on blocks 402 to 406 may refer to the description on blocks 302 to 306 of FIG. 9. In another embodiment, in block 404, the SMA layer 204 may have an original flat shape (e.g., a twinned martensite phase) in response the SMA layer 204 is deposited on a wafer (not shown). In block 406, in response to a die 202 being released from a support substrate (not shown), the SMA layer 204 may be deformed with warpage of the die 202. In block 408, the die 202 may be attached to the substrate 206 through a die attach adhesive 203. The SMA layer 204 may undergo a phase change from the deformed shape to the original flat shape in response to rise of a temperature during the die attaching. Then, the SMA layer 204 may return to an original twinned martensite phase in response to the temperature of the die 202 and/or the substrate 206 being cooled down.

While the methods of FIGS. 9 and 10 are illustrated to comprise a sequence of processes, the methods in some embodiments may preform illustrated processes in a different order. Further, while the embodiments herein are illustrated to comprise a certain number of dies, interconnects, substrates, chips, some embodiments may apply to a different number.

While certain features of the invention have been described with reference to embodiments, the description is not intended to be construed in a limiting sense. Various modifications of the embodiments, as well as other embodiments of the invention, which are apparent to persons skilled in the art to which the invention pertains are deemed to lie within the spirit and scope of the invention.

What is claimed is:

1. A semiconductor package, comprising:
   a substrate;
   a semiconductor die that is coupled to the substrate by a set of one or more interconnects provided on one side of the semiconductor die;
   a shape memory alloy layer provided on another side of the semiconductor die to compensate a warpage shape of the semiconductor die.

2. The semiconductor package of claim 1, wherein the shape memory alloy layer has a transformation temperature that is lower than a temperature that is to bond one of the set of interconnects to the substrate.

3. The semiconductor package of claim 1, wherein the shape memory alloy layer has a transformation temperature that equals to a temperature that is to bond one of the set of interconnect to the substrate.

4. The semiconductor package of claim 1, wherein the shape memory alloy layer comprises a shape memory alloy that has a transformation temperature in a range of 200° C. to 260° C.

5. The semiconductor package of claim 1, wherein the shape memory alloy layer comprises a shape memory alloy that has a transformation temperature in a range of 100° C. to 200° C.

6. The semiconductor package of claim 1, wherein the shape memory alloy layer comprises a material selected from a group consisting of copper-zinc-aluminium-nickel alloy, copper-aluminium-nickel alloy, iron-manganese-silicon, and nickel-titanium alloy.

7. The semiconductor package of claim 1, comprising:
an adhesive to attach the semiconductor die to the substrate, wherein a temperature to cure the adhesive is higher than a transformation temperature of the shape memory alloy layer.

8. The semiconductor package of claim 1, wherein the shape memory alloy layer comprise shape memory alloy that has a transformation temperature not higher than a reflow temperature of a solder to couple the die to the substrate.

9. The semiconductor package of claim 1, comprising:
a back side metallization layer that is provided on the shape memory alloy.

10. The semiconductor package of claim 1, wherein the shape memory alloy layer has a restoration force to change from the warpage shape to a flat shape at a transformation temperature to flatten the semiconductor die.

* * * * *